United States Patent [19]

Street et al.

[11] Patent Number: 4,785,186
[45] Date of Patent: Nov. 15, 1988

[54] AMORPHOUS SILICON IONIZING PARTICLE DETECTORS

[75] Inventors: Robert A. Street, Palo Alto; Victor P. Mendez, Berkeley; Selig N. Kaplan, El Cerrito, all of Calif.

[73] Assignee: Xerox Corporation, Stamford, Conn.

[21] Appl. No.: 921,302

[22] Filed: Oct. 21, 1986

[51] Int. Cl.⁴ .............................................. G01T 1/24
[52] U.S. Cl. ..................... 250/370.14; 250/370.01; 250/370.02
[58] Field of Search .......... 250/370 K, 370 F, 370 R, 250/370 A; 357/2

[56] References Cited

U.S. PATENT DOCUMENTS

| | | | |
|---|---|---|---|
| 4,163,240 | 7/1979 | Swinehart et al. | 250/370 F |
| 4,409,605 | 10/1983 | Ovshinsky et al. | 357/2 |
| 4,419,578 | 12/1983 | Kress | 250/391 |
| 4,611,224 | 9/1986 | Seki et al. | 357/2 |

FOREIGN PATENT DOCUMENTS 186766 12/1980 Japan ................................ 250/370

Primary Examiner—Carolyn E. Fields
Assistant Examiner—John A. Miller
Attorney, Agent, or Firm—W. Douglas Carothers, Jr.

[57] ABSTRACT

Amorphous silicon ionizing particle detectors having a hydrogenated amorphous silicon (a—Si:H) thin film deposited via plasma assisted chemical vapor deposition techniques are utilized to detect the presence, position and counting of high energy ionizing particles, such as electrons, x-rays, alpha particles, beta particles and gamma radiation.

17 Claims, 10 Drawing Sheets

AMORPHOUS SILICON IONIZING PARTICLE DETECTORS

This invention was made, in part, with Government support under Contract No. DE-AC03-76SF00098 awarded by the Department of Energy. The Government has certain rights in this invention.

BACKGROUND OF THE INVENTION

This invention relates to devices for detecting and counting charged or ionizing particles passing into or through the device and more particularly relates to an amorphous silicon detector sensitive to any ionizing radiation such as electrons, x-rays, alpha particles, beta particles and gamma radiation.

Single crystal solid state detectors, especially those fabricated from silicon ang germanium, have enjoyed a long and productive history as radiation detectors. The single crystal restriction, unfortunately, results in high cost and limited sensitive area. If noncrystalline semiconductors could be made sufficiently sensitive to low levels of radiation, they would, for certain applications, circumvent the need for single crystals, and allow the easy manufacture of large area position sensitive sensors. Moreover, because they are already in a state of greater disorder, they could be expected to be considerably less senitive to radiation damage than their single crystal counterparts. Furthermore, in the case of amorphous silicon (a—Si) versus crystal silicon, a—Si has the advantage of being deposited on any type of substrate and also being deposited in multiple successive layers.

Recently, starting with the work of W. E. Spear et al in 1976, amorphous silicon (a—Si) growth with few defects has been possible the plasma decomposition of silane ($SiH_4$) with an alteration of its conductivity by suitable doping such as $PH_3$ and $B_2H_6$ in the plasma assisted chemical vapor deposition process. This has lead to the extensive investigation of amorphous silicon in the research and development of photovoltaic or solar cells with intensive work to improve their conversion efficiency. Representative examples of amorphous silicon photovoltaic devices are found in U.S. Pat. No. 4,419,696 and 4,500,744 and also in Japanese publication No. 56-51880 published May 9, 1981. These devices are of the Schottky barrier type, p-i-n tpe and combination Schottky barrier and p-i-n type, respectively.

Recent advances in the fabrication of amorphous silicon devices, particularly in deposition techniques that produce layers with low trap densities, have encouraged us to investigate amorphous silicon as a ionizing particle detector.

SUMMARY OF THE INVENTION

According to this invention, hydrogenated amorphours silicon (a—Si:H) thin films are deposited using plasma assisted chemical vapor deposition techniques for detecting the presence, position and counting of high energy ionizing particles, such as electrons, x-rays, alpha particles, beta particles and gamma radiation. It has not been contemplated or known up to the time of this invention to use amorphous silicon (a—Si:H) thin films as a detector for such high energy ionizing particles.

An amorphous silicon ionizing particle detector of this invention comprises a substrate, a first electrode formed on the substrate, an a—Si:H film formed over a first electrode, and a second electrode formed over the a—Si:H film. The a—Si:H film comprises three monolithic layers, a layer of a first conductivity type, an intrinsic layer and a layer of a second conductivity type forming a p-i-n structure. The film may also be comprised of a Si—Ge alloy to take advantage of the stronger interaction of ionizing radiation with heavier elements giving improved sensitivity. As an example, it is known that Ge concentrations up to 20% in Si, forming a Si—Ge alloy, do not seriously degrade the electronic properties of the film. Also, a film of CsI may deposited upon a—Si:H film to improve sensitivity in the detection of ionizing particles, such as x-ray particles. Also, at least a planar portion of a—Si:H film may be disposed at an angel transverse to the path of incoming high energy ionizing particles to enhance the sensitivity of the detector. Further, to increase the sensitivity of the detector, a series stack of detectors may be formed, one on another. Lastly, the detectors of this invention may be formed in detector arrays for increasing sensitivity to inbound particle radiation.

While amorphous silicon films have been used for photocells and solar cells, there has been no contemplation of their use and application as a high energy ionizing particle detector, that is, a method of detecting high energy particles by providing a detector having an amorphous silicon film comprising a p-i-n structure with a layer of a first conductivity type, an intrinsic layer and a layer of a second conductivity type, the film being sandwiched between metal electrodes, placing the detector in line with inbound ionizing particle radiation, detecting the radiation absorbed by the detector by collecting the electron-hole pairs generated by the penetration of the radiation, and measuring the current output from the detector due to the carrier collection.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

1. Embodiments

Figure 1:
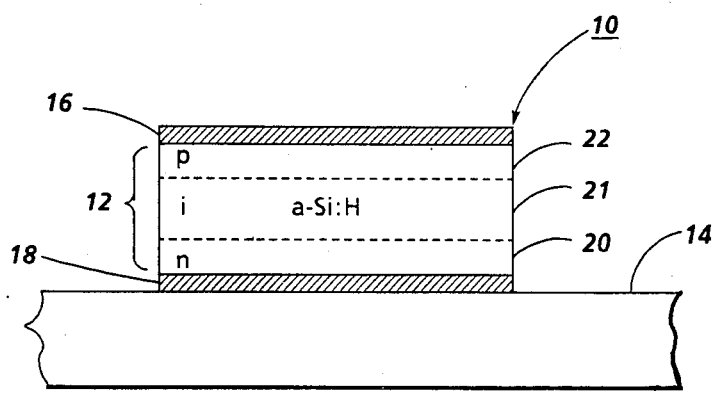
FIG. 1 illustrates an amorphous silicon detector comprising one embodiment of this invention.

Referring to FIG. 1, there is shown a first embodiment of this invention. Detector 10 comprises a thin film 12 of a —Si:H on a glass, plastic or metal substrate 14. Substrate 14 can be of any suitable material that will withstand the deposition process, for example, 250° C. for plasma assisted CVD. A top metal contact or electrode 16 and a bottom surfaces of film 12. The electrodes 16 and 18 may be Cr—Au, Ni, Al Cr, Pt, Pd, Mo or Ti or any other metal that will form a suitable contact or electrode that is known in the art. Film 12 is formed of three layers 20, 21 and 22 of amorphous silicon to form a p-i-n type detector. These layers are formed as a continuous film 12 wherein the doping is modulated during growth to produce the n type layer 20, intrinsic layer 21 and p type layer 22.

In a further embodiment of this invention, heavy elements, such as from Group 6 of the Periodic Table, in particular Ge may be introduced in the plasma deposition process to from a Si—Ge alloy of film 12. The constituency of Ge may be up to 20%. A film of Si—Ge alloy provides for stronger interaction of ionizing radiation to improve sensitivity of the detector. The alloying of a heavy element increases the sensitivity of detector 10 because the inbound ionizing particles will be caused to stop at shorter depths into detector 10 so that electron-hole pairs will be provided at a faster rate and will dissipate faster to zero momentum.

Figure 1A:
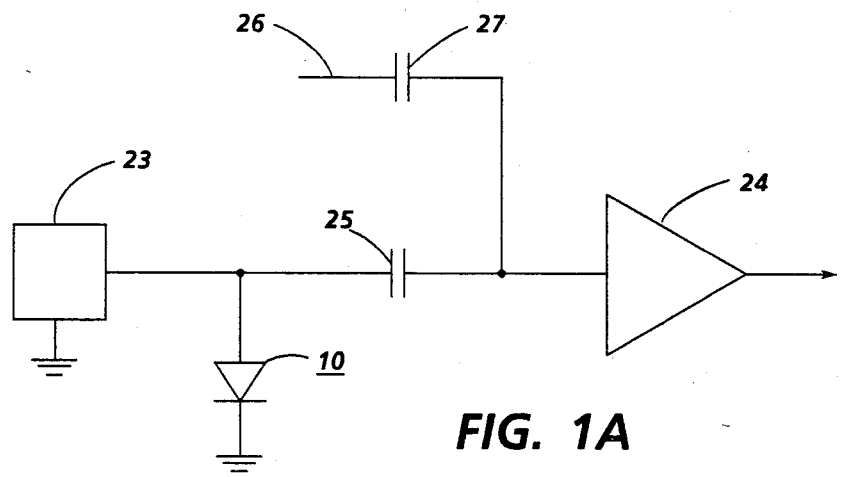
FIG. 1A schematically illustrates the circuit operation of the detector of FIG. 1.
Figure 1B:
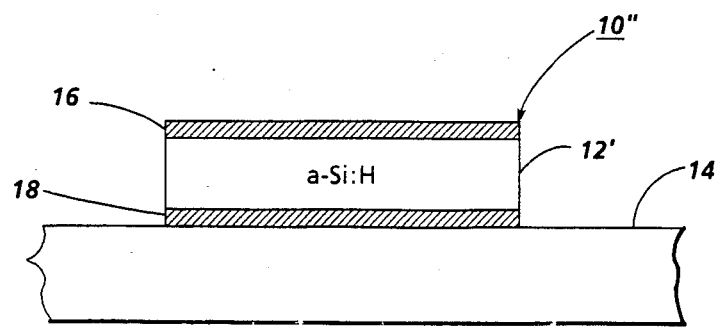
FIG. 1B illustrates an amorphous silicon detector comprising another embodiment of this invention.
Figure 1C:
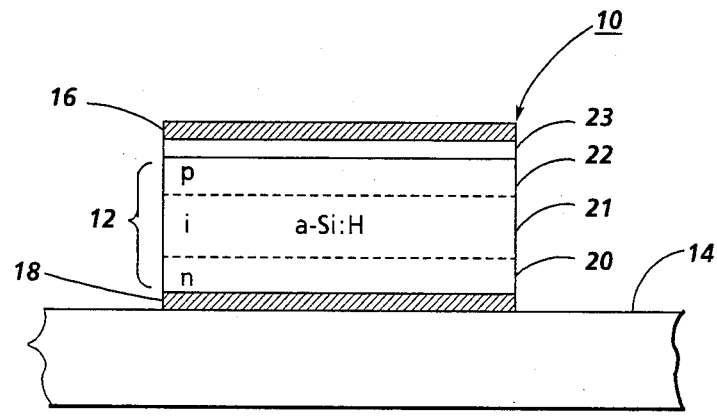
FIG. 1C illustrates an amorphous silicon detector incorporating a CsI layer comprising another embodiment of this invention.

For the purpose of x-ray detection and possibly other types of ionizing radiation, the sensitivity of the film to such radiation is increased when a layer of CsI is formed on the top surface of film 12 prior to the deposition of electrode 16, as illustrated in FIG. 1C. Layer 23 of CsI will emit light when exposed to ionizing particles. The light will pass into the detector 10 and cause a current to flow.

The layer of amorphous silicon may be deposited via plasma CVD or sputtering. Doping the n type layer 20 is accomplished by doping with phosphorus or elements in Group V of the Periodic Table. The intrinsic layer 21 may be made to contain a low density of defects by causing a small amount of hydrogen to be included in the layer. The p type layer 22 is accomplished by doping with boron or elements in Group III of the Periodic Table. The particular devices herein disclosed have been fabricated using plasma CVD. The doping elements are sequentially introduced during the plasma decomposition of Silane gas or derivative thereof. The thickness of film 12 should be in the range of 1 $\mu$m to 15 $\mu$m. If the film is too thick, the carriers have to propagate too far into the film. The electrodes 16 and 18 should be thick enough to make good contact with film 12 but should not be so thick as to interfere with particle penetration into film 12. For example, these electrodes may be from 200 Å to 500 Å thick. In fabrication, the bottom electrode material may be vapor deposited on the surface of substrate 14 followed by the plasma deposition of film 12 and then the vapor deposition of electrode 16. Individual devices can then be etched and cut apart as supported on a substrate section.

FIG. 1A illustrates the test setup for the detector 10. Detector 10 is placed across a bias supply 23. The output of detector 10 is connected to the input of amplifier 24 via coupling capacitor 25. Also connected to the input of amplifier 24 is a test pulse input at 26 via coupling capacitor 27. In operation, ionizing particles, penetrating detector 10 from the top surface, generate electron-hole pairs in the film bulk which is proportional to the number of generated pairs. This current if then amplified by amplifier 24. The test pulse input provides a means for calibrating the amplifier so that a benchmark can be established as to the amount of current generated by the penetrating ionizing particles. This test setup will be explained in greater detail in connection with the test system disclosed in FIG. 5.

FIG. 1B illustrates another embodiment of this invention involving a back-to-back Schottky diode, a—Si:H ionizing particle detector 10''. Detector 10'' is deposited on substrate 14 and comprises bottom metal contact or electrode 18, a—Si:H film 12', and upper contact or electrode 16. The same methods of deposition may be utilized as previously discussed in connection with FIG. 1. Metal electrodes 16 and 18 are preferred to be of a metal having a barrier to current flow, such Pt, Au or Pd. In the samples to be discussed later, Cr was used as the electrode metal, but it is believed that improved results would obtained with the use of Pt, Au or Pd.

Figure 2:
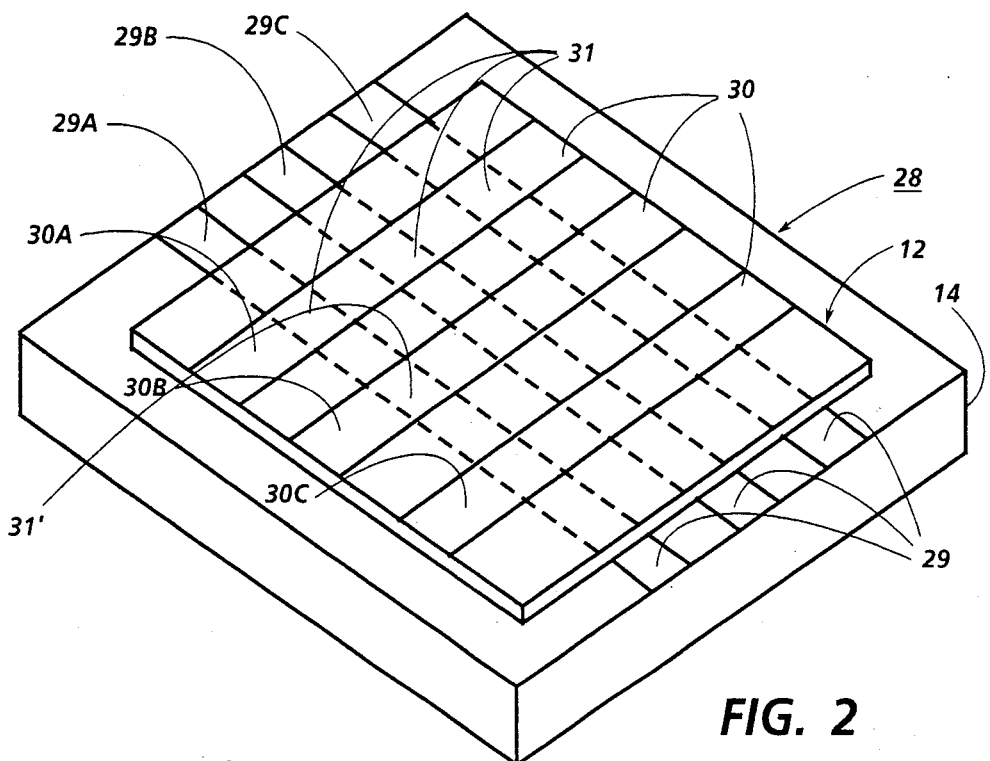
FIG. 2 is an isometric view of a detector array utilizing the embodiment shown in FIG. 1.

FIG. 2 is a perspective view of a detector array 28 comprising glass substrate 14 and a first set of parallel spatially formed metal strip electrodes 29 are formed on substrate 14. An a—Si:H film 12, such as previously described in FIG. 1, is deposited on electrode set 29. A second set of parallel spatially formed metal strip electrodes 30 are formed on the top surface of film 12 and which are oriented orthogonally relative to the first set of electrodes 29. As a result, individual vertical detectors making up the array 28 are formed at the cross points 31 of electrodes 29 and 30. Particle position detection can be accomplished at selected cross points 31. For example, a current reading can be taken between electrodes 29A and 30B to determine detection of particles at cross point detector 31'. By well known electronic techniques, sequential scanning of a full array can be accomplished to determine the amount of detected particles occurring at any particular detector location in array 28. Electrodes 29 and 30 are connected across the bias supply in the same manner as illustrated in FIG. 1A for electrodes 16 and 18 for individual detector 10.

If the individual detectors 10 are staked in series, the efficiency of electron-hole pairs also increases. Thus, for the two stack diode detector 10' shown in FIG. 3, twice as many ionizing particles may be detected. Detector 10' comprises two diodes 11A and 11B, each comprising a thin film 12A of a—Si:H, and formed on a glass substrate 14. An intermediate metal contact or electrode 17 and a bottom metal contact or electrode 18A are respectively formed on the top and bottom surfaces of film 12A. A second thin film 12B of a—Si:H is formed on electrode 17 and a top electrode 16A is formed on the surface of film 12B. Again, electrode 16A, 17 and 18 may be Cr—Au, Ni, Al, Cr, Pt, Pd, Mo or Ti or any other suitable metal. Films 12A and 12B are formed of three layers 20, 21 and 22 of amorphous silicon to form a p-i-n type detector. These layers are formed as a continuous film wherein the doping is modulated during growth to produce the n type layer 20, intrinsic layer 21 and p type layer 22 in each film 12A and 12B.

Figure 3:
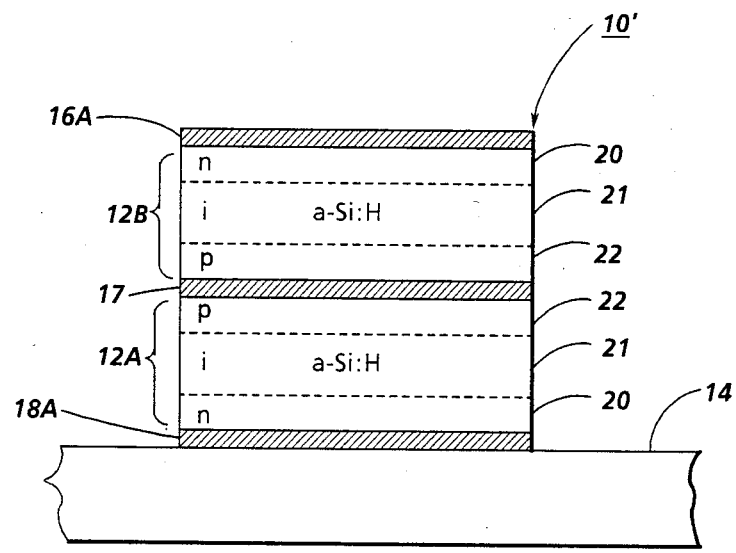
FIG. 3 illustrates an amorphous silicon detector comprising still another embodiment of this invention.

It should be understood that the series stack in FIG. 3 is not limited to two diodes 11A and 11B, as there may be a plurality of diodes to provide for further enhancement of sensitivity.

Figure 3A:
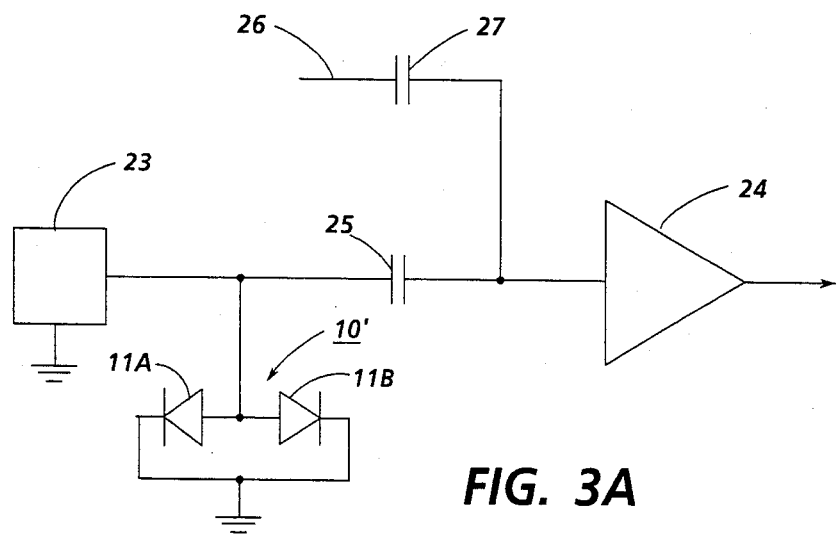
FIG. 3A schematically illustrates the circuit operation of the detector of FIG. 3.

FIG. 3A illustrates the test setup for the detector 10'. Detector 10' is placed across a bias supply 23. The intermediate electrode or detector output is connected to one side of supply 23 while the end electrodes 16A and 18A are connected to the other side of supply 23. The output of detector 10' is connected to the input of amplifier 24 via coupling capacitor 25. Also connected to the input of amplifier 24 is a test pulse input at 26 via coupling capacitor 27. In operation, ionizing particles penetrating detector 10' from the top surface generate electron-hole pairs in the film bulk which are collected at the respective electrodes 16 and 18 forming a current which is proportional to the number of generated pairs. This current is then amplified by amplifier 24. The test pulse input provides means for calibrating the amplifier so that a benchmark can be established as to the amount of current generated by the penetrating ionizing particles. As previously indicated, this test setup will be explained in greater detail in connection with the test system disclosed in FIG. 5.

Figure 4:
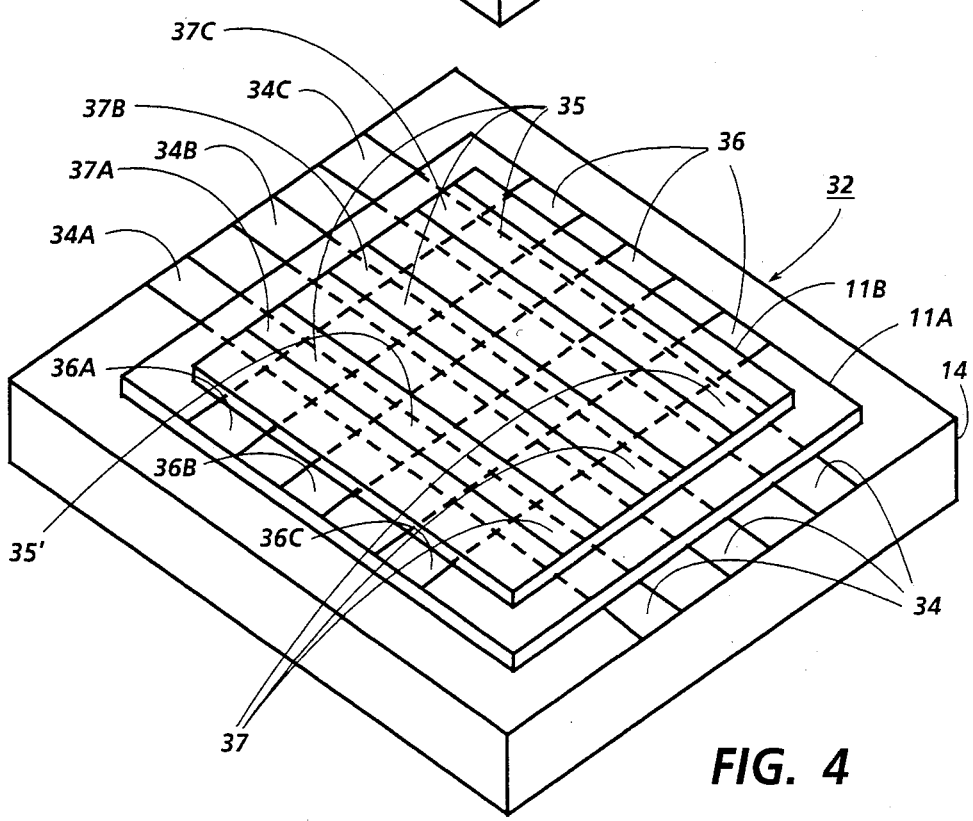
FIG. 4 is an isometric view of a detector array utilizing the embodiment shown in FIG. 3.

FIG. 4 is a perspective view of a detector array 32 comprising glass substrate 14 and a first set of parallel, spatially formed metal strip electrodes 34 formed on substrate 14. A first a—Si:H film 11A is deposited upon the electrode set 34. A second set of parallel spatially formed metal strip electrodes 36 are formed on the top surface of film 11A and which are oriented orthogonally relative to the first set of electrodes 34. A second a—Si:H film 11B is deposited upon the second electrode set 36. This followed with by a third set of parallel, spatially formed metal strip electrodes 37 being formed on the top surface of film 11B and which are oriented orthogonally relative to the second set of electrodes 36 but parallel with the first set of electrodes 34. Electrodes 34 and 37 are connected across the bias supply 23 in the same manner as illustrated in FIG. 3A for electrodes 16A, 17 and 18A for individual detector 10'. The electrodes of each set 34, 36 and 37 are connected in common and the first and third sets of electrodes 34 and 37 are connected together to one side of bias supply 23. The electrodes of the second set are connected to the other side of supply 23 and also to the input of amplifier 24. It should be noted that electrode sets 34, 36 and 37 may also be formed at a different angle relative to each other, 45°, and need not be perpendicular to one another. Individual detectors making up array 32 are formed at the cross points 35 of electrodes 34, 36 and 37. Particle position detection can be accomplished at selected cross points 35. For example, a current reading can be taken between electrodes 34A, 36B and 37A to determine detection of particles at the detector formed at cross point 35'. By well known electronic techniques, sequential scanning of a full array can be accomplished to determine the amount of detected particles occurring at any particular detector location in array 32.

2. Studied Detector Samples

The detector samples studied were all hydrogenated amorphous silicon (a—Si:H) devices that ranged in thickness from 1 $\mu$m to 15 $\mu$m. These devices were fabricated by plasma decomposition of silane gas. Depositions were made over a thin conducting bottom contact on a glass substrate. During the deposition of the a—Si:H, parameter such as gas pressure, gas mixture (diborane for p doping and phosphine for n doping) which was modulated to provide the p-i-n profile, gas flow rates, R.F. power, and sample temperature, were controlled in a manner that can produce dangling bond densities in the intrinsic layer of about $10^{15}$cm$^{-3}$. Diborane for p doping and phosphine for n doping may be in the range of 0.1% to 3% of silane. These devices have electron mobility of the order of 2 cm$^2$/Vsec and hole mobility of the order of $5 \times 10^{-3}$cm$^2$/Vsec at room temperature. Depositions can be made in a continuous operation at a rate of about 1 $\mu$m per hour.

Initial device samples were fabricated without any doping, and with Cr contact on top and bottom. This configuration formed two back-to-back Schottky barriers. Later fabricated devices employed p-i-n junctions fabricated by introducing the appropriate doping gases for short periods of time at the beginning, and the end of the a—Si:H deposition. The last group of devices fabricated were two layer n-i-p-p-i-n stacked detectors.

Figure 5:
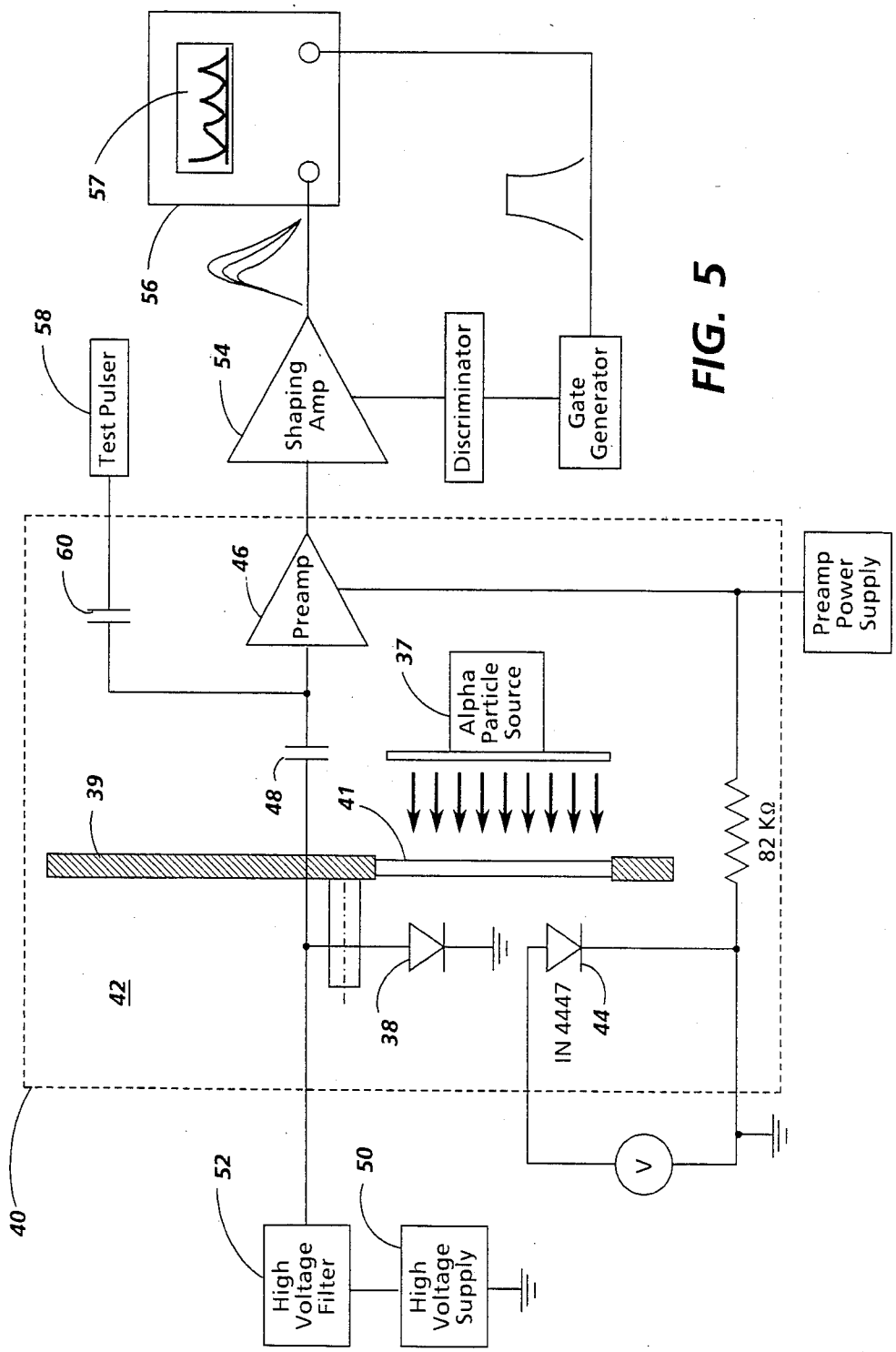
FIG. 5 is a test system using a vacuum chamber for testing detectors according to this invention.

The testing system is shown in FIG. 5. The a—Si:H detector 38 to be tested, for example, one of the detectors 10, 10'' or 10' of FIGS. 1, 1B or 3, and ionizing particle source 37, i.e. a 241 Am alpha particle source, were mounted in chamber 42 of a Ge(Li) detector housing 40 in anticipation of the need for cooling of the detector 38 as well as to provide a vacuum for alpha particle detection. The source 37 was mounted upstream from a disk 39 that contained thin aluminized Mylar absorber windows of one, two and three layer thickness, one open window, and a windowless region that would block the alphas emission completely. Thus, there were four window regions and one region that acted as a stop to radiation. A single layer window 41, which is illustrated in position in FIG. 5, comprises of aluminized Mylar material which was approximately 0.05 $\mu$m Al and 8 $\mu$m Mylar. A four layer thickness window of this type was sufficient to stop all alpha particles. Active use of a window was accomplished by mounting the windows on the disk and the disk was rotated by using a magnet mounted on the outside of housing 40. The energy of the alpha particles emerging from each of the windows were measured using a Si crystal detector 44.

Detector 44 and an amplifier 46(Amptek amplifier A225) were mounted on an aluminum support block (not shown) that was attached to the cold finger of the recycled Ge(Li) detector chamber 42. The measurement results were all taken at room temperature.

The detector samples were all of about the same size, approximately $1.5 \times 1.5$ cm in area and the thickness of each detector ranged from 1 $\mu$m to 15 $\mu$m, not including the thickness of the thin glass substrate. The samples were mounted on thin copper laminate PC boards as the substrate material with etched copper conducting strips. The bottom contact of the detector samples 38 were connected to the copper strips with silver epoxy paint. The PC board was held onto the support block by means of spring clamps. Contact to ground reference was made through the clamps. The top contact of the detector samples 38 was made with a tiny spring loaded, gold plated finger, which was connected to the input of amplifier 46 through a coulpling capacitor 48 and to high voltage supply 50 through a high voltage filter 52 comprising a resistor. The Amptek amplifier 45, while self contained, also having an output shaping circuit, did not produce a large enough output signal for the particular pulse height analyzer (PHA) 56 employed, so an additional external amplifier 54 was utilized.

Test calibration pulses were used to determine the input charge equivalent of the detector pulses. The test pulses originated as long voltage steps from a Datapulse 101 pulse generator 58, whose amplitude was measured on a Tektroniz 2465 oscilloscope. This calibration voltage was then attenuated as required, terminated in 50 ohms at the amplifier, and coupled into the input of amplifier 46 through a coupling capacitor 60 of 2.5±0.2 pf.

Figure 6:
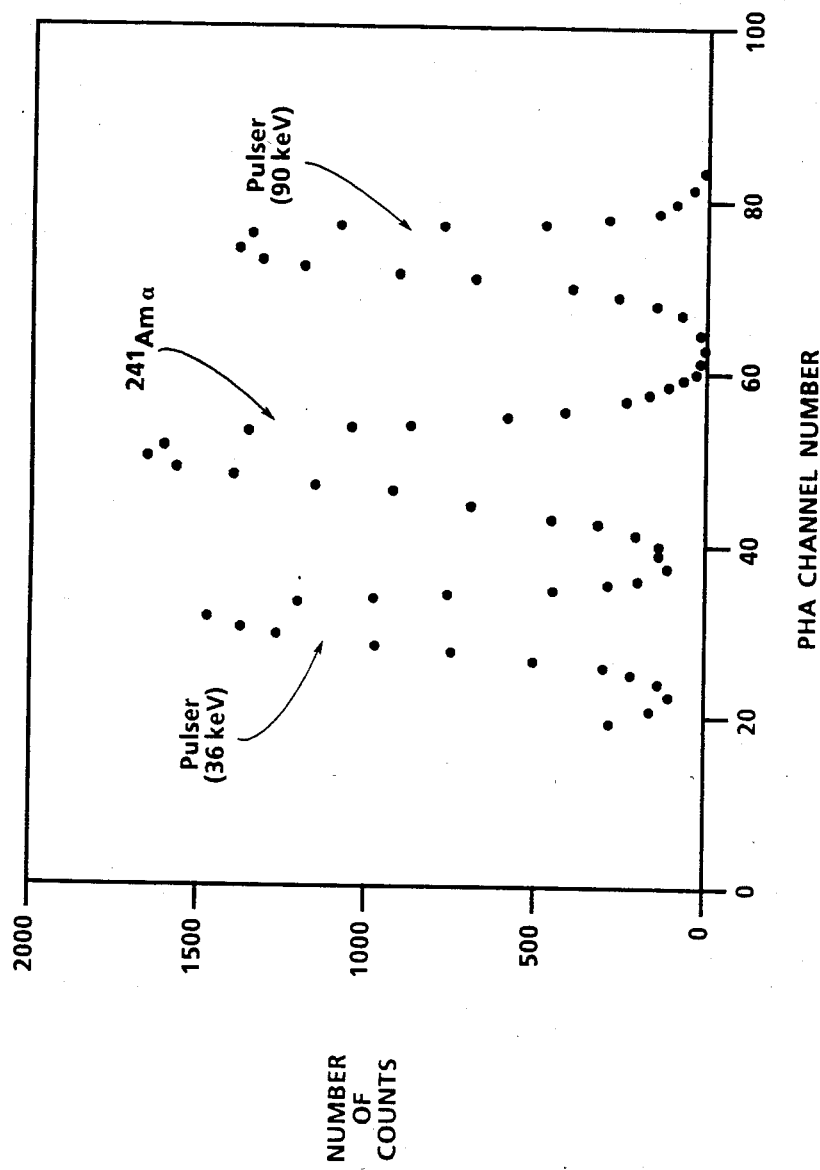
FIG. 6 is a pulse height and analyzer spectrum obtain during testing of a detector according to this invention with the system shown in FIG. 5.

An example from display 57 of the PHA 56 for a detector sample 38, for both pulser and alpha particle signals is shown in FIG. 6. The PHA spectrum in FIG. 6 show an alpha peak and two pulser calibration peaks. The data is from a 2 μm p-i-n detector 10 of FIG. 1 biased at −90 V. The energy equivalence of the pulser calibration peaks was determined both by direct comparision with a full energy alpha pulse in a Si crystal detector 44, and by calculation, from the measured value of test capacitor 60. The equivalent energy of the pulser signal, $E_t$ was taken to be, $$E_t = V_t C_t W_{Si}/e,$$

where $V_t$ is the attenuated test pulse voltage, $C_t$ is the test capacitance, $W_{Si}$ is 3.62 eV/electron-hole pair, and e is the electron charge. An absolute calibration check against a full energy alpha peak with a normal crylstalline Si detector, in a different setup, agreed, to within 5%, with test pulse values.

As previously indicated, the first detector samples tested were back-to-back Schottky diodes. These samples had uniformly deposited bottom metal contacts and top metal contacts in the shape of 2- and 3-mm-diameter circles. Chromium (Cr) as employed as the contact material. However, Pt, Au or Pd are believed to perform better due to their current barrier properties. The Cr and the a—Si:H deposited layer formed Schottky barriers at both contacts. The measursments made indicated that there was consistently a very significant difference in leakage and noise between the two barriers, and successful measurement could only be made by back biasing the upper Schottky barrier. The detector samples ranged in thickness from 1 μm to 15 μm.

The later detector samples tested had bottom metal contacts deposited as 1 mm wide metal strips separated from one another by 2 mm. The top contacts were deposited in the same pattern, but with the lines perpendiculat to the bottom lines as previously described in connection with FIG. 2. The purpose of this patterning is to utilize the geometry of a position sevsitive detector configuration, where the signal origin could be localized to the intersection of two perpendicular, planar spatial electrodes. Some of these samples were 10 μm thick and were of the Schottky type, while others were 2- and 5 μm thick and were of the p-i-n type.

Measurements were also conducted on a two layer stacked detector samples previously described relative to FIG. 3. As previously indicated, these detector samples comprise an n-i-p diode deposited on top of a p-i-n diode. The second deposited n-i-p diode was masked in a manner so that signal contact could be made with the middle set of metal strips as illustrated in FIG. 4.

Alpha particle signal size and noise were measured as a function of applied bias for the tested two layer stacked detectors. Typically two different test pulse amplitudes were superimposed on each experimental measurement to provide input signal calibration. Alpha particle signals were able to be detected from nearly all of the detectors tested. The thinnest diodes of the Schottky diode type with the circular contact patterns tested to produce detectable signals were 5 μm thick. These devices also contained some p doping. Signals were also detected from detector samples 7.5 μm and 15 μm thick. With the exception of the 15 μm sample, which was biased as high as 150 V, the detectors would hold no more than about 40 V. Observations from these detectors showed that all of the segments on a single detector, defined by the circular contact areas, performed consistently with regard to signal size, noise, and efficiency. In all cases the signal continued to rise with increasing high voltage. However, the single size was not obviously bigger for the thicker detectors, nor was there a significant change in signal size with alpha energy attenuation using the absorber windows. One would expect the signal size from a thick detector to decrease with decreasing incident alpha energy, and from a thin detector to increase with increasing alpha energy.

Figure 7:
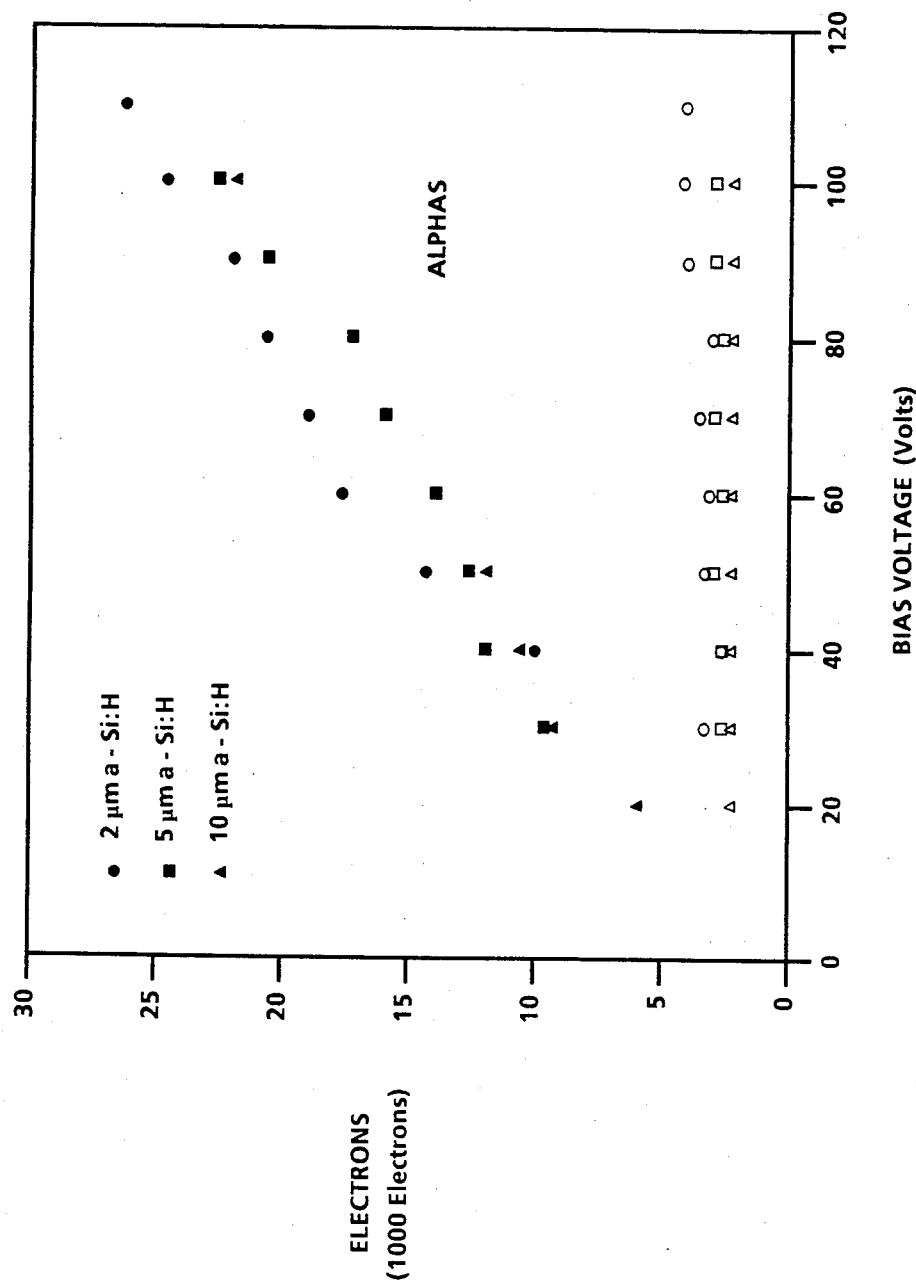
FIG. 7 is a graphic illustration of the signal to noise comparison for pin type detectors according to this invention having three different thicknesses.

The later test p-i-n detector samples had much better high voltage characteristics. The 2 μm thick detector samples operated to 100 V of bias, so it was possible to do a direct comparison of three different detectors, of thickness 2, 5, and 10 μm, respectively, over the same range of bias voltage. This comparison is illustrated in FIG. 7. Within cross calibration uncertainties, the signal size appears to be the same for all detectors, independent of physical thickness. The noise, represented as the FWHM of the calibration pulse, also plotted on a curve shown at the bottom of FIG. 7, is not significantly different for each of the three different detector samples nor does noise increase with applied voltage. Thus, within measurement uncertainties, both signal and noise were identical, independent of detector thickness.

Figure 8:
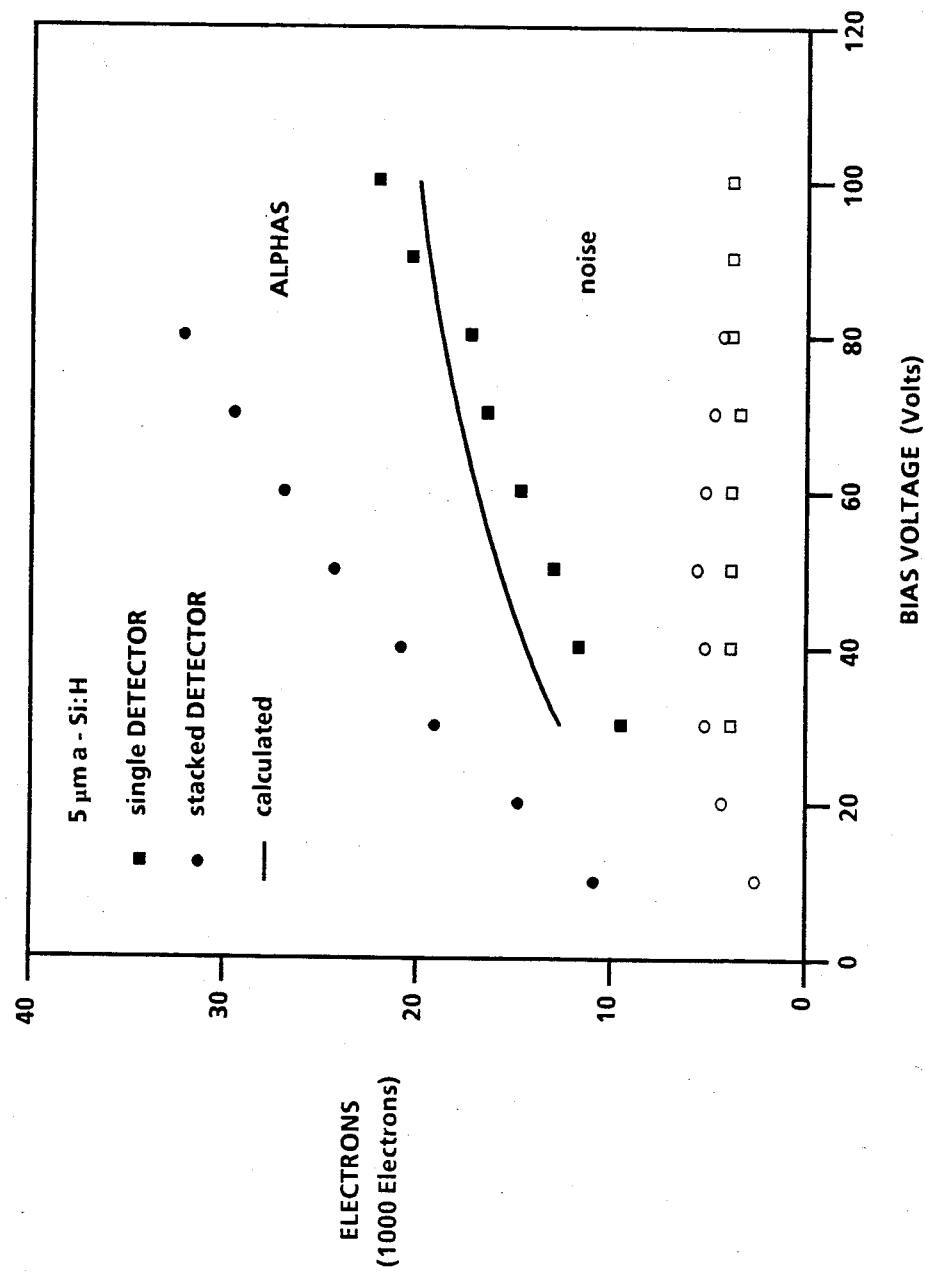
FIG. 8 is a graphic illustration of the signal to noise comparison for a single pin type detector and a stacked pin type detector according to this invention having three different thicknesses.

FIG. 8 illustrates a direct comparison between a single 5 μm thick detector sample of the type illustrated in FIG. 1 and a stack of two back-to-back 5 μm detectors of the type illustreated in FIG. 3. To be noted is that the signal from the stacked detector sample is about twice as large as that from the single detector while noise is not significantly different between the devices.

Figure 9:
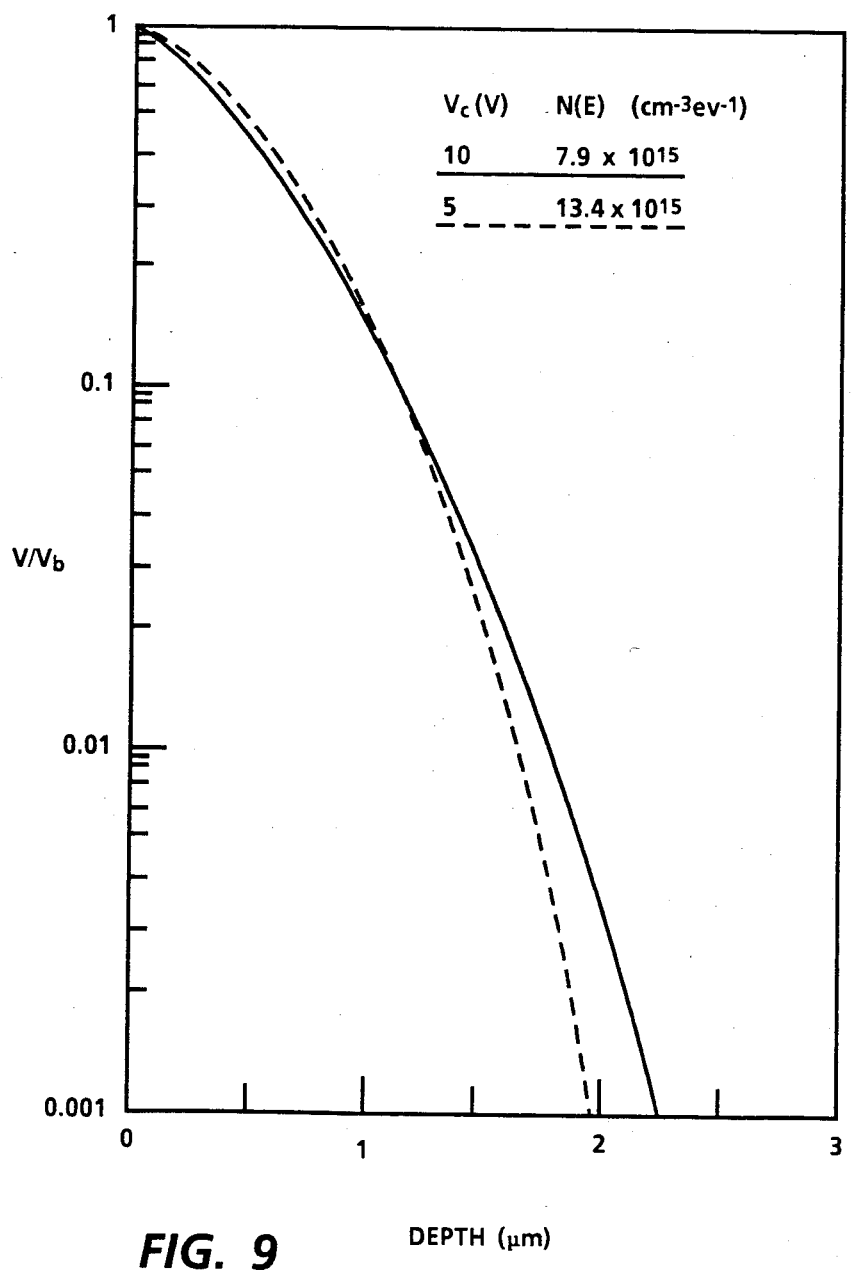
FIG. 9 is a graphic illustration of the modelilng for determining the potential detectable as a function of detector depth.

At the low voltage at which measurements were made on these a—Si:H diode detector samples, the voltage and field are found to fall off exponentially as a function of depth, indicating that the charge density of some depth in the material is directly proportional to the voltage (or field) at that depth. The charge density of the material cannot increase indefinitely as the applied voltage is increased, and will eventually reach some saturated value. In order to model this field dependent charge density, as well as its eventual saturation, the assumption was made that the ionized trap density is directly proportional to voltage up to some critical voltage, $V_c$, and then becomes constant. For voltages below $V_c$ the potential and field will decrease exponentially with depth. By assuming a charge density proportional to voltage, a hyperbolic sine solution for a finite thickness sample may be obtained. For voltages above $V_c$, the field will vary linearly and the potential parabolically with depth. The assumption has also been made that collection of all of the electrons produced by the ionizing particle can be realised, but none of the much-lower-mobility holes. The shape of this model potential as a function of depth z, is shown in FIG. 9. It has the form of:

$$V_{(z)} = V_c[\sinh f(t-z)]/[\sinh f(t-t_c)] \qquad z > t_c$$
$$= V_c[f^2(t_c-z)^2/2 + f(t_c-z)\cosh f(t-t_c) + 1] \quad z < t_c$$

where t is detector thickness, and $t_c$ is the depth at which $V = V_c$, and is determined by the condition that $V(0) = V_b$, the applied bias, f is the effective e-folding depth for the potential, $$f(in \mu m^{-1}) = 1.228\sqrt{N(E)},$$

and (NE) is the energy density of shallow traps measured in units of $10^{15}$ cm$^{-3}$eV$^{-1}$.

Assuming a uniform energy loss rate of 150 keV/$\mu$m for the alpha particle passing through the thin detector, and that all the electrons are collected, the expected signal size would be:

$$e = 150 \int_o^t V/V_b dz \text{ keV}.$$

The only adjusted parameters in the model above are the energy density of shallow traps N(E), and the "critical" potential, $V_c$, at which saturation of deep trap ionization is reached. In the actual calculation, the value for $V_c$ was set and it was found that the value of N(E) that provided the best "least squares" fit for the purpose of observing signal size. The two parameters vary inversely, and, within a factor of two, or more, the calculated fit is not very sensitive to the exact choice of either parameter. This is because it is only the region at high potential that contributes significantly to detector signal size. This effect can be seen from the two curves illustrated in FIG. 9.

The trap densities and electron mobilities of presently producible amorphous silicon diode detectors are already at a level that permits detection of alphs particles passing through the detector. While measurements show that the effective sensitive thickness of these particular diode detectors is less than 2 $\mu$m, results have also shown that a back-to-back pair of diode detectors of the type shown in FIG. 4 will give twice the signal as compared to a single diode detector of the type shown in FIG. 1.

Simple model calculations in FIG. 9 explain the effective sensitive thickness of the detector and the increase in signal size with applied voltage in a way that is consistent with the measured electric field profiles discussed in the article of Robert A. Street, *Physics Review*, Vol. B27, Page 4924 et seq. (1983). The log slope of the electric field, and the ionized trap density, that best fit the data are comparable to, but somewhat greater than those obtained by direct measurement on similar material. At the high voltages and peak fields of these measurements, and with no account being taken of other effects such as the kinetics of trapping and release of carriers, the precise meaning of the fitted values is not completely clear. They nevertheless describe the behavior of the material and provide a sound basis for prediction and comparison, i.e., the theoretical finding here is consistent with what has been found relative to the testing illustrated in FIG. 7.

The fitted data was based on signals from alpha particles passing through the windowless aperture in the absorber disk. On the basis of the simple model of FIG. 9, one could expect to see a larger signal from alpha particles that had first passed through three thicknesses of mylar absorber window in the disk. Instead, a slightly smaller signal was observed. This is still an unresolved issue, but could imply signal saturation. A consequence of such saturation would be that less heavily ionizing particles would give relatively larger signals than could be inferred from linear extra polation.

Even without further significant improvement in the quality of the amorphous material itself, it would be possible to make sufficiently large p-i-n stacks from presently developed amorphous silicon materials to produce a useful position sensitive detectors for minimally detectable particles. Detection of minimally detectable particles would require stacks of ten or more amorphous silicon p-i-n diodes in the manner described in connection with FIG. 3.

Figure 10:
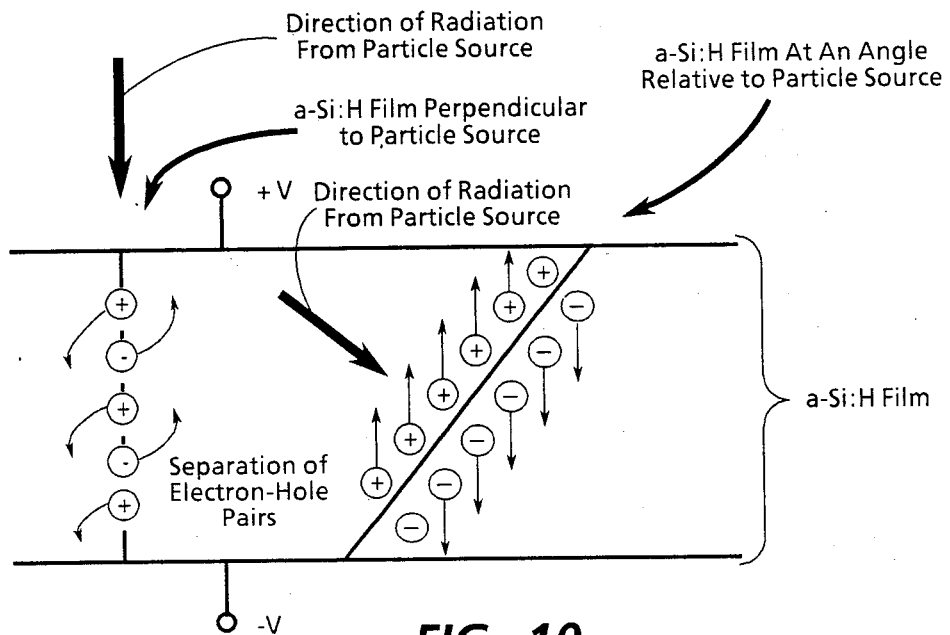
FIG. 10 is a schematic illustration for enhancing detector sensitivity.

If the plane of the film is transverse to the path or direction of inbound ionizing particle radiation, two important effects are obtained. First, the actual path length for particles to penetrate and traverse the film is longer if the film is at an angle relative to the direction of the inbound ionizing particle radiation compared where the plane of the film is normal to the path of the inbound ionizing particle radiation. As a result, the sensitivity of the detector will be increased because more carriers will be collected due to the thicker film length. Second, as illustrated in FIG. 10, such an arrangement permits the separate electrons and holes to be oriented in a manner not to interfere with one another and, therefore, more rapidly propagate to the appropriate electrode. Radiation that is normal to the plane of the film will generate electron-hole pairs that interfere with one another during the process of propagating to its appropriate electrode, as illustrated in FIG. 10. Thus, the rate of collection of carriers is enhanced if the film plane is at an angle relative to the path of radiation.

Figure 11:
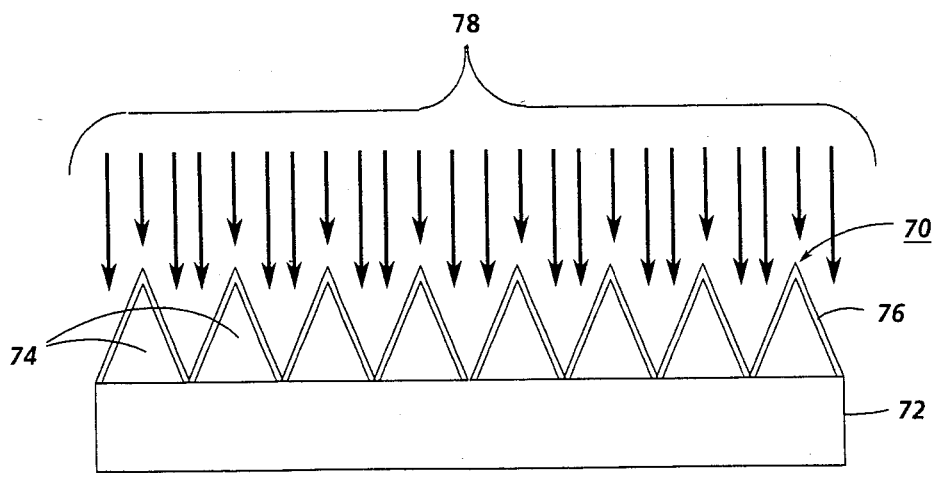
FIG. 11 illustrates an amorphous silicon detector comprising still another embodiment of this invention, taking advantage of the enhancement illustrated in FIG. 10.

FIG. 11 illustrate one embodiment of this invention wherein the film is disposed at an angle relative to the inbound radiation. Detector 70 comprises a substrate 72 upon which is formed a plurality of elongated triangular shaped ridges 74. An a—Si:H film 76 is formed upon the surface of ridges 74 including electrodes or contacts, that is an electrode is first formed on ridges 74 followed by the deposition of film 76. The plasma CVD method of deposition ensures that the film will have uniform thickness, regardless of the shape of the substrate. This is not possible with crystalline film. This is followed by the deposition of the other electrode on the surface of film 76. The configuration, therefore, is the same as that shown for FIG. 1. The inbound radiation 78 penetrates the film 76 at an angle to provide for an increase in film path length to increase detector sensitivity as well as enhance the rate of electron-hole generation as explained in connection with FIG. 10.

It should be understood that there are many obvious modifications for the geometry shown in FIG. 11. For example, the entire planar surface of the film could disposed at an angle relative to the path of the inbound radiation or just a portion of the film may be disposed at an angle to the path of the inbound radiation. On the other hand, the detector per se may disposed at an angle relative to the path of the inbound radiation.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A particle detector having a body portion for detecting high energy ionizing particles moving in a path toward said detector where, upon penetration into said detector body portion, form electron-hole pairs and comprising:
   a substrate,
   first electrode means formed on said substrate,
   an a—Si:H film deposited on said first electrode,
   said a—Si:H film comprises three monolithic, contiguous regions consecutively comprising an a—Si region doped to be a first conductivity type, an intrinsic region of a—Si and an a—Si region doped to be a second conductivity type,
   second electrode means formed over said a—Si:H film,
   means to increase the sensitivity to a level sufficient to detect single ionizing particles as they individually impact said detector body portion by increasing the collection efficiency of said a—Si:H film intrinsic region to have a low trap density below $1 \times 10^{16}$ cm$^{-3}$ev$^{-1}$ with a large film thickness above 1 μm and operative at voltages above 50 volts per μm, and
   means to collect said electron-hole pairs and indicate the number and energy level of said ionizing particles.

2. The particle detector of claim 1 where said a—Si:H film comprises a single intrinsic layer of a—Si having a thickness in the range of 1 μm to 15 μm.

3. The particle detector of claim 1 comprising
   a plurality of said a—Si:H film detectors formed in a stack on said substrate,
   electrode means formed between the first of said detectors and said substrate,
   electrode means formed between adjacently stacked detectors forming one or more intermediate electrode means,
   electrode means formed on the top most detector of said stack,
   said intermediate electrode means being commonly connected together according to the conductivity type of the adjacently formed detector,
   voltage bias means connected across said commonly connected electrode means.

4. The particle detector of claim 1 comprising a Si—Ge alloy wherein said Ge comprises about 3%–20% atomic weight to advance the interaction of said particles with said film and so as to enhance the sensitivity of said detector.

5. The particle detector of claim 1 formed as detector array wherein
   said first electrode means comprises a first set of spatially formed parallel electrodes on said substrate,
   said second electrode means comprises a second set of spatially formed parallel electrodes on said film,
   said second electrode set being substantially orthogonal to said first electrode set forming electrode cross points with said film to function as individually addressed detectors in said array.

6. The particle detector of claim 1 including means to dispose at least a planar portion of said film at an angle transverse to the path of incoming high energy ionizing particles to enhance the sensitivity of said detector.

7. A method for improving the detection of high energy ionizing particles which comprises the steps of:
   providing a detector body portion of a—Si:H film, said film being sandwiched between a pair of electrodes,
   increasing the sensitivity level of said a—Si:H film sufficient to detect single ionizing particles as they individually impact said detector body portion by increasing the collection efficiency of said a—Si:H film to have a low trap density below $1 \times 10^{16}$ cm$^{-3}$ev$^{-1}$ with a large film thickness above 1 μm and operative at voltages above 50 volts per μm,
   placing the detector in a path of ionizing particle radiation wherein said radiation is separated into electron-hole pairs as said radiation penetrates into said detector body portion,
   separating and collecting said electron-hole pairs,
   detecting said collected electron-hole pairs by measuring the output current response upon collection thereof wherein each detected current output pulse is representative of a single electron-hole pair, and counting said current output pulses.

8. The method of claim 7 wherein said detector is a back-to-back Schottky diode.

9. The method of claim 7 wherein said detector is a p-i-n diode.

10. The method of claim 7 wherein said detector is a stack of p-i-n diodes.

11. The method of claim 7 which includes the steps of:
    calibrating the current output pulses from the detector with a known source to determine the energy of the particles detected.

12. The method of claim 7 which includes the steps of:
    providing a series of stack detectors to enhance the efficiency of collection of electron-hole pairs.

13. A single particle detector having a body portion for detecting high energy ionizing particles moving in a path toward said detector, said detector comprising a combination of contiguous films of a—Si:H film and CsI, said CsI film causing said particles to be converted into photons, said a—Si film sensitive to said photons and separating them into electron-hole pairs, means to collect said electron-hole pairs indicative of the number and energy level of said ionizing particles.

14. The particle detector of claim 13 wherein said a—Si:H film comprises three monolithic, contiguous regions consecutively comprising a Si region doped to be a first conductivity type, an intrinsic region and a Si region doped to be a second conductivity type.

15. A single particle detector having a body portion for detecting high energy ionizing particles moving in a path toward said detector where, upon penetration into said detector body portion, form electron-hole pairs,
    means to separate said electron-hole pairs and collect the separated electrons and holes indicative of the number and energy level of said particles,
    a—Si:H film comprising said body portion and having at least, in part, a planar surface for receiving said particles and generating said electron-hole pairs, means to support said film planar surface at an angle transverse to said particle path to increase the path length of particle penetration in said film and to permit the unincumbered separation and collection of said electron-hole pairs without interference in the collection of other separated electrons and holes so as to increase the sensitivity level of particle detection.

16. The particle detector of claim 15 wherein said a—Si:H film comprises three monolithic, contiguous regions consecutively comprising a Si region doped to be a first conductivity type, an intrinsic region and a—Si region doped to be a second conductivity type.

17. The particle detector of claim 15 wherein said support means comprises a support member having a plurality of elongated triangular shaped ridges spatially across said member, said ridges having one or more sides disposed at an angle transverse relative to said particle path.

* * * * *